United States Patent [19] [11] Patent Number: 4,942,152
Itozaki et al. [45] Date of Patent: Jul. 17, 1990

[54] PROCESS FOR PREPARTING A BISMUTH-TYPE COMPOUND OXIDE SUPERCONDUCTOR

[75] Inventors: Hideo Itozaki; Keizo Harada; Shuji Yazu, all of Hyogo, Japan

[73] Assignee: Sumitomo Electric Industries, Ltd., Osaka, Japan

[21] Appl. No.: 400,819

[22] Filed: Aug. 30, 1989

[30] Foreign Application Priority Data

Aug. 30, 1988 [JP] Japan ................................. 63-216036

[51] Int. Cl.$^5$ ............................................ C01F 11/02
[52] U.S. Cl. ........................................ 505/1; 156/606; 156/609; 156/610; 204/192.24; 423/593; 423/604; 505/725; 505/730; 505/731; 505/782; 505/784
[58] Field of Search ................... 505/1, 816, 819, 725, 505/730, 731, 732, 782, 784; 427/62, 248.1; 204/192.24; 156/609, 610, 606; 423/593, 604

[56] References Cited

PUBLICATIONS

S. A. Shaheen et al., Solid State Communications, vol. 66, No. 9, pp. 947–951, 1988.
Brian T. Sullivan et al., Appl. Phys. Lett., 52(23), pp. 1992–1994, Jun. 6, 1988.
A. B. Harker et al., Appl. Phys. Lett., 52(25), pp. 2186–2187, Jun. 20, 1988.
C. E. Rice et al., Appl. Phys. Lett., 52(21), pp. 1828–1830, May 23, 1988.
Osamu Inoue et al., Japanese Journal of Appl. Physics, vol. 27, No. 3, pp. L347–L349 (1988).
R. Gross et al., Nature, vol. 332, pp. 818–819, Apr. 1988.
W. Korczak et al., Solid State Communications, vol. 66, No. 9, pp. 971–973, (1988).
Masao Nakao et al., Japanese Journal of Applied Physics, vol. 27, No. 3, pp. L378–L380 (1988).

*Primary Examiner*—G. L. Kaplan
*Attorney, Agent, or Firm*—Kerkam, Stowell, Kondracki & Clarke

[57] ABSTRACT

A novel process for preparing superconductor of bismuth-containing compound oxide such as Bi—Sr—Ca—Cu system.

In the present invention, firstly an intermediate compound oxide containing metal elements of the superconductor except bismuth is prepared and then the intermediate compound oxide is contacted with bismuth oxide vapour at a temperature between 750° and 950° C. so that bismuth oxide is reacted with said intermediate compound oxide.

20 Claims, 1 Drawing Sheet

PROCESS FOR PREPARING A BISMUTH-TYPE COMPOUND OXIDE SUPERCONDUCTOR

BACKGROUND OF THE INVENTION

1. Field of the Invention

The present invention relates to a novel process for preparing compound oxide type superconductors, more particularly, a novel process for preparing superconductors of bismuth-containing compound oxides such as Bi—Sr—Ca—Cu system.

2. Description of the Related Art

The superconductivity is a phenomenon which is explained to be a kind of phase change of electrons under which the electric resistance becomes zero and the perfect diamagnetism is observed. Under the superconductivity, permanent current of high density flows without any loss. Therefore, when the technology of superconductivity can be applied to electric power transmission, power loss of about 7%, which is lost in the electric power transmission today, can be saved greatly. Development of superconductors is also expected in the field of measurement and of medical treatment such as NMR, $\pi$ neutrons medical treatment or high-energy physical experiments. In the applications of electromagnets for generating strong magnetic fields, the technology of superconductivity is expected to accelerate development of the technology of fusion power generation, MHD power generation, magnetic levitation trains and magnetically propelling ships.

Several superconducting devices have been proposed and developed in electronics. A typical application of the superconductor is Josephson device in which quantum efficiency is observed macroscopically when an electric current is passed through a weak junction arranged between two superconductors. The tunnel junction type Josephson device is expected to be a high-speed and low-power consuming switching device owing to a smaller energy gap of the superconducting material. Development of the superconducting devices such as high-speed logic units or of no power-loss wiring materials is also demanded in the field of high-speed computers in which the power consumption per unit area is reaching to the upper limit of the cooling capacity with increment of the integration density in order to reduce energy consumption.

The critical temperature "Tc" of superconductivity, however, could not exceed 23.2K of $Nb_3Ge$ which was the highest Tc for the past ten years. The possibility of an existence of new types of superconducting materials having much higher Tc was revealed by Bednorz and Müller, who discovered a new oxide type superconductor in 1986 (Z. Phys. B64, 1986 p189).

It had been known that certain ceramic materials of compound oxides exhibit the property of superconductivity. For example, U.S. Pat. No. 3,932,315 discloses Ba—Pb—Bi type compound oxide which shows superconductivity and Japanese patent laid-open No. 60-173,885 discloses that Ba—Bi type compound oxides also show superconductivity. These superconductors, however, possess rather lower transition temperatures of about 10K and hense usage of liquidized helium (boiling point of 4.2K) as cyrogen is indispensable to realize superconductivity.

The new type compound oxide superconductor discovered by Bednorz and Müller is represented by [La,Sr]$_2$CuO$_4$ which is called the $K_2NiF_4$-type oxide having a crystal structure which is similar to known perovskite type oxides. The $K_2NiF_4$-type compound oxides show such higher Tc as 30K which are extremely higher than known superconducting materials. It was also reported that C. W. Chu et al, discovered, in the United States of America, another superconducting material, so called YBCO type represented by YBa$_2$Cu$_3$O$_{7-x}$ having the critical temperature of about 90K in Feb. 1987 (Physical Review letters, Vol. 58, No. 9, p 908).

Maeda et al reported the other type new superconducting material of Bi—Sr—Ca—Cu—O system (Japanese Journal of Applied Physics. Vol. 27, No. 2, p 1209 to 1210).

Bismuth type compound oxides are chemically much more stable than the abovementioned YBCO type compound oxide and have such a very important merit that high Tc superconductors of higher than 100K can be realized without using rare earth elements as a constituent element so that the production cost can be reduced.

The above-mentioned new types of superconducting materials can be obtained by solid reaction in a bulk form of sintered block which was obtained by sintering a powder mixture of oxides or carbonates of constituent metal elements which has predetermined atomic ratios.

They can also be deposited on a substrate in a form of a thin film by physical vapour deposition (PVD) technique such a RF sputtering vacuum deposition, ion-plating or MBE or chemical vapor deposition (CVD) technique such as thermal CVD, plasma CVD, photo-CVD or MOCVD.

In the case of production of bismuth type oxide superconductors, however, there is a special problem, because the vapour pressure of bismuth (Bi) is very different from the other constituent elements, so that it is very difficult to control the composition of the product. Still more, the products obtained by the conventional process are porous sintered articles having relatively lower density and being not homogeneous in quality. Therefore, it is requested to improve the quality of bismuth type compound oxides.

An object of the present invention is to overcome the problem of the conventional process and to provide a novel process for preparing high Tc bismuth type superconductors such as a Bi—Sr—Ca—Cu system of high quality easily.

SUMMARY OF THE INVENTION

The present invention provides a process for preparing a superconductor of bismuth-containing compound oxide, characterized by the steps comprising preparing "an intermediate compound oxide" containing metal elements except bismuth which are constituent elements of the product superconductor and then subjecting the intermediate compound oxide to heat-treatment at a temperature between 750° and 950° C. in an atmosphere of bismuth oxide vapour, so that bismuth oxide is reacted with the intermediate compound oxide to produce the product superconductor.

The bismuth oxide vapour is preferably created by heating bismuth oxide powder in a chamber.

The product superconductor according to the present invention is preferably in a form of thin film deposited on a substrate and also can be a block or a pre-shaped article such as a coil or a ring.

The process according to the present invention is applicable to any bismuth-containing compound superconductor including the following typical system represented by the general formula:

$$Bi_4(Sr_{1-x}, Ca_x)_m Cu_n O_{p+y}$$

in which "m", "n", "x" and "y" are numbers each satisfying respective ranges of $6 \leq m \leq 16$, $4 \leq n \leq 12$, $0.2 < x < 0.8$ and $-2 \leq y \leq +2$ and $p = 2(6+m+n)$.

The compound oxides of this system consist mainly of the following formula: $Bi_4Sr_4Ca_4Cu_6O_{20+y}$ or $Bi_2Sr_2Ca_2Cu_3O_{10+y}$.

As the other type bismuth-containing compound oxides to which the present invention is applicable, it can be mentioned the following systems:

Bi—Po—Sb—Sr—Ca—Cu—O system (132K),
(Bi, Tl, Pb)—Sr—Ca—Cu—O system (110K),
Bi—Pb—Sr—Ca—Cu—O system (107K),
Bi—Y—Ba—Cu—O system (100K),
Bi—(Sr,Ln)—Cu—O system (32 to 42K),
 (note) Ln:lanthanide element

DESCRIPTION OF THE PREFERRED EMBODIMENTS

Figure 1:
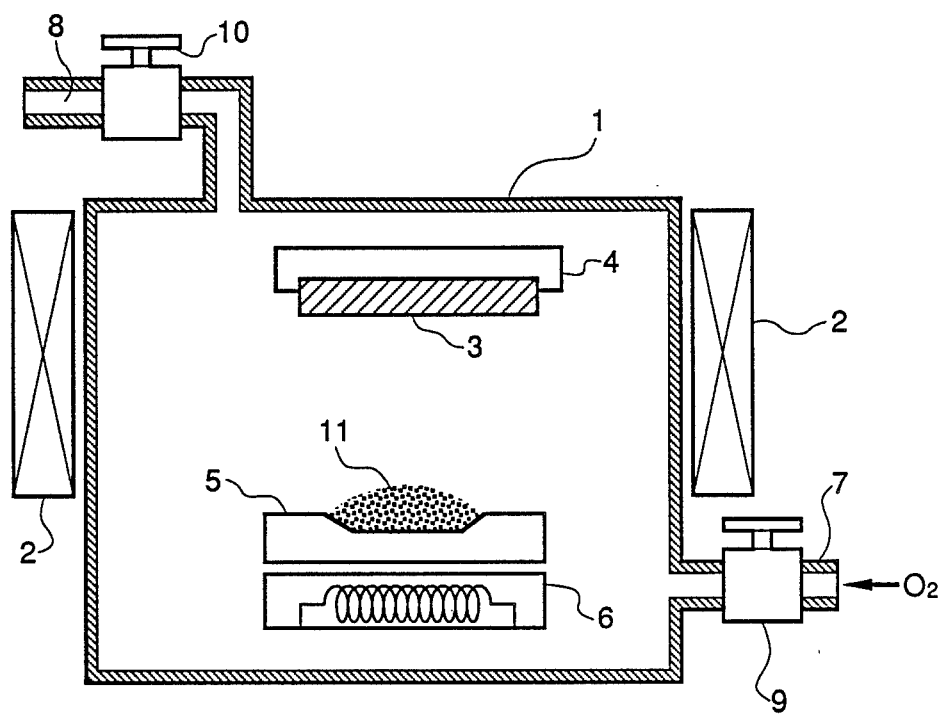
FIG. 1 is an illustrative view of an apparatur which can be used for carrying out the process according to the present invention.

As described above, in the case of bismuth type compound oxides, it is very difficult to control effectively the composition of the product, because bismuth (Bi) has a very different vapour pressure from the other constituent metal elements.

The essence of the present invention resides in that the final product of compound oxide is not produced directly as is the case of the conventional process but is produced by two steps. Namely, in the process according to the present invention, an intermediate compound oxide or a parent body is prepared firstly from the other constituent metal elements except bismuth which have a different vapour pressure comparing to the other constituent metal elements at the first stage and then bismuth oxide is added to the resulting intermediate compound oxide or a parent body obtained.

The intermediate compound oxide or parent body can be in a form of a block or a shaped article but is preferably in a form of a thin film since the superconductor prepared by the process according to the present invention is obtained in the neighborhood of a surface of the intermediate compound or parent body.

The first stage for preparing the intermediate compound oxide of the other metal elements except bismuth and oxygen can be effected by the conventional solid reaction, physical vapour deposition or chemical vapour deposition.

The block or shaped article of the intermediate compound oxide or parent body can be prepared by solid reaction or sintering technique. In this case, a sintered mass of the intermediate compound oxide containing the other metal elements except bismuth is prepared by the steps of mixing powders of oxides, carbonates, nitrate or fluorides each containing at least one of the other constituent metal elements of the intermediate compound oxide in such a manner that a powder mixture contains the constituent metal elements in predetermined atomic ratios and then sintering the powder mixture. It is preferable to repeat the sintering operation and pulverization for more than one time. This solid reaction can be effected without difficulty because the vapour pressures of the other metal elements except bismuth are not so much different from each other.

As stated above, the intermediate compound oxide or parent body is preferably in a form of a thin film. Namely, the superconductor prepared by the process according to the present invention is obtained in the neighborhood of a surface of the intermediate compound or parent body because bismuth reacts mainly with the surface of the intermediate compound.

When a thin film is used as the intermediate compound or parent body, such thin film can be prepared by physical vapour deposition (PVD) technique such as RF magnetron sputtering, vacuum deposition, ion-plating, MBE or by chemical vapor deposition (CVD) technique such as thermal CVD, plasma CVD, photo CVD, MOCVD or the like. When RF magnetron sputtering, vacuum deposition or ion-plating method is used as the physical vapour deposition technique, the atomic ratios of metal elements contained in a vapour source or a target is adjusted according to a difference in the evaporation rate as well as difference in adsorption of metal elements to the substrate. The vapour source is preferably a sintered mass which is prepared by a powder-sintering technique of a material power mixture comprising metal elements and/or their oxides or carbonates or a sintered powder which is obtained by pulverizing the sintered mass. The vapour source can be also divided into a plurality of segments. In the case of the molecular beam epitaxy (MBE), elemental metals of Bi, Sr, Ca and Cu or their compounds such as their oxides are evaporated by means of a K-cell or an ion beam gun. In this case, oxygen is supplied, if necessary, separately or additionally into an evaporation atmosphere.

The substrate on which the intermediate compound oxide is deposited is preferably a single crystal of MgO, $ZrO_2$, $SrTiO_3$, $LiNbO_3$, $LiTaO_3$, $LaAlO_3$, $LaGaO_3$ or the like. It may be used $LiAlO_3$, $LiCaO_3$, $KTaO_3$, $CaF_2$, $BeF_2$, CSZ, YSZ or silicon. When a single crystal of silicon is used as the substrate, a buffer layer of MgO or $ZrO_2$ is preferably interposed between the intermediate compound oxide layer and the substrate.

The final superconductor obtained by the process according to the present invention shows crystalline anistropy in electric resistance, so that the current passing along a direction which is in parallel to a plane defined by a-axis and b-axis of the cyrstal show a very high critical current density, while the current passing along c-axis is relatively lower. Therefore, it is preferable to give a desired orientation of crystal to the thin film. For example, when the thin film of the intermediate compound oxide is deposited on {001} plane of a single crystal of MgO or $SrTiO_3$, the c-axis of the crystal of the thin film deposited is oriented perpendicular or nearly perpendicular to surface of the thin film, so that the critical current density (Jc) along the surface is improved. In special applications, it is possible to use {110} plane of the substrate of $SrTiO_3$ in order to orient the c-axis of the crystal of the thin film deposited in parallel to the surface so that higher current density is obtained to the direction of depth. The substrate made of a single crystal of MgO or $SrTiO_3$ is preferable because their thermal expansion coefficient is similar to that of the intermediate compound oxide and hence the thin film of the intermediate compound oxide does not receive serious thermal shock or stress by heat history caused by heating and cooling of the substrate.

In a preferred embodiment, a thin film of an intermediate compound oxide of Sr—Ca—Cu—O system is deposited firstly on a substrate made of a single crystal of MgO by sputtering technique. A target used in the sputtering is a sintered block of Sr—Ca—Cu—O system compound oxide or sintered powder obtained by pulverizing the sintered block. In this case, the substrate is heated at a temperature between room temperature and 800° C. Then, the resulting thin film is exposed to or contacted with a mixture of bismuth vapour and oxygen gas or bismuth oxide vapour at a temperature between 750° and 950° C. so that bismuth/oxygen or bismuth oxide react with the intermediate compound oxide.

The contact of the intermediate compound oxide with the mixture of bismuth vapour and oxygen gas or bismuth oxide vapour can be effected in a closed chamber in which bismuth oxide vapour is created by heating a vapour source such as bismuth oxide powder. In a variation, a mixture of bismuth vapour and oxygen gas or bismuth oxide vapour produced outside the chamber can be introduced into the chamber.

In the second stage, the intermediate compound oxide is preferably heated at a temperature between 750° and 950° C. If the temperature is not higher than 750° C. the intermediate compound oxide is not activated so that the reaction with bismuth doesn't proceed satisfactorily. To the contrary, if the temperature is not lower than 950° C., the trapped bismuth atoms escape from the intermediate compound oxide so that the objective bismuth containing compound oxide is not obtained.

It is preferable to heat the vapour source at higher temperature than the intermediate compound oxide. If necessary, a suitable flux can be used in order to increase vapour pressure of the vapour source such as bismuth compound. This heat-treatment is continued preferably for a time duration between 5 minutes and 5 hours.

It is also preferable to increase the partial pressure of oxygen in the chamber in order to control the oxygen contents in the final product. The partial pressure of oxygen depends on the nature of the compound oxides to be produced and is selected usually about 1 atm.

The process according to the present invention is applicable to production of elongated articles such as wire, because the addition of bismuth can be effected in a relatively short time. Namely, a superconducting wire can be prepared by exposing a core made of the intermediate compound oxide to bismuth oxide vapour according to the present invention.

Now, an apparatus for carrying out the present invention will be described with reference to the attached drawings.

FIG. 1 is an illustrative view of an apparatus which can be used for carrying out the process according to the present invention. The apparatus is a closed furnace 1 which is provided with an inlet port 7 having a valve 9, an outlet port 8 having a valve 10, a substrate holder 4, a boat 5 for receiving bismuth-containing compound thereon and a heater 6 for heating the boat 6. The furnace 1 is surrounded by an outer heater 2 which heats the furnace from outside. The boat 5 is faced to the substrate holder 4 so that bismuth vapour produced from the boat 5 is directed directly to a substrate 3 supported on the holder 4. The furnace 1 has relief valve (not shown).

In operation, the substrate 3 having a thin film of intermediate compound oxide thereon is secured on the substrate holder 4. A block of intermediate compound oxide can be used in place of the substrate 3. Powder of bismuth-containing compound such as bismuth oxide is placed on the boat 5. Firstly, the furnace 1 is vacuumed through the outlet port 8. After the valve 10 is closed, oxygen gas is introduced into the furnace 1 and then the valve 9 is closed. Then, the heater 6 is energized to evaporate the bismuth-containing compound for example at 1,040° C. and simultaneously the outer heater 2 is also energized to heat the substrate 3 having the intermediate compound oxide at 880° C.

According to the present invention, the following advantages are obtained:

(1) The proportion of bismuth in the superconductor can be controlled precisely.

(2) Homogeneous superconductors can be obtained.

(3) The operation for adding bismuth can be carried out easily in relatively short time. Therefore, the process according to the present invention is applicable to production of elongated articles such as wire.

Now, the present invention will be described with reference to examples, but the scope of the invention should not be limited to them.

EXAMPLE 1

Preparation of the intermediate compound oxide

The parent body or intermediate compound oxide was produced in a form of a thin film which was prepared by magnetron RF sputtering method.

A target used in the RF-magnetron sputtering was prepared by mixing intimately powders of oxides of Sr, Ca and Cu in such proportions that the atomic ratios of respective elements of Sr:Ca:Cu became 2:2:3 and then sintering the powder mixture at 900° C. for 12 hours. The resulting sintered mass of Sr—Ca—Cu compound oxide was pulverized to a sintered powder which was used as a powder target. A thin film of Sr—Ca—Cu compound oxide was deposited on {110} plane of MgO substrate under the following condition:

| | |
|---|---|
| Substrate temperature | 760° C. |
| Sputtering gas pressure | 0.01 to 0.1 Torr |
| Sputtering gas | $Ar/O_2 = 1:1$ |
| RF frequency power | 100 W |
| Thickness of the film | 0.2 μm |

Preparation of the superconductor

The resulting thin film as the intermediate compound oxide was subjected to heat-treatment with bismuth oxide vapour according to the present invention as following:

The MgO substrate 3 having the thin film of Sr—Ca—Cu compound oxide was secured to the holder 4 as is shown in FIG. 1. The boat 5 which was faced to the substrate 3 was filled with bismuth oxide powder.

The furnace 1 was vacuumed through the outlet port 8. After the valve 10 was closed, oxygen gas was introduced into the furnace 1 and then the valve 9 was closed so that the interior of the furnace is filled with oxygen gas. Then, the heater 2 was energized to heat the interior of the furnace to 880° C., while the heater 6 was energized to heat the boat 5 up to 1,040° C. When the boat 5 was heated at 1,040° C., this temperature was maintained for one hour and then the heaters were de-energized.

After the furnace was cooled down to room temperature, the MgO substrate was taken out of the furnace to measure the critical temperature. Namely, the MgO substrate was dipped in liquid helium in a cryostat at 8K in order to confirm that the thin film deposited on the substrate was changed to a superconductor, the temperature was elevated gradually to determine a critical temperature (Tc) where the thin film showed ordinal resistance.

It was confirmed that the critical temperature (Tc) of the thin film obtained was 97K.

EXAMPLE 2

Example 1 was repeated but, in this Example, the intermediate compound oxide was exposed to bismuth oxide vapour directly.

Namely, the sintered block of the intermediate compound oxide which was prepared by the same method as is described in "preparation of the intermediate compound oxide" of Example 1 was supported by the holder 4 and was heat-treated with bismuth oxide vapour.

The resulting heat-treated block showed a Tc of 105K.

EXAMPLE 3

Example 1 was repeated except that the intermediate compound oxide of Sr—Ca—Cu was replaced by an intermediate compound oxide of Pb—Sr—Ca—Cu. In this Example, Pb was added in a form of lead oxide and the atomic ratios in the material powder were adjusted to Pb:Sr:Ca:Cu =0.3:2:2:3. Sintering was effected at 900° C. for 5 hours.

The resulting heat-treated thin film showed a Tc of 110K.

We claim:

1. A process for preparing a superconductor of a bismuth-containing compound oxide, characterized by the steps comprising preparing an intermediate compound oxide composed of metal elements which are constituent elements of said superconductor except bismuth, and subjecting said intermediate compound oxide to heat-treatment at a temperature between 750° and 950° C. in an atmosphere containing bismuth oxide vapour so that bismuth oxide reacts with said intermediate compound oxide to produce the superconductor.

2. The process set forth in claim 1 wherein said bismuth oxide vapour is created by heating bismuth oxide powder in a chamber.

3. The process set forth in claim 1 wherein said superconductor is in a form of a thin film deposited on a substrate.

4. The process set forth in claim 1 wherein said intermediate compound oxide has a form of a thin film prepared on a substrate by physical vapour deposition technique.

5. The process set forth in claim 4 wherein the substrate is a single crystal of MgO, SrTiO$_3$, LaAlO$_3$ or LaGaO$_3$.

6. The process set forth in claim 5 wherein the thin film is deposited on {100} plane or {100} plane of the substrate.

7. The process set forth in claim 4 wherein said physical vapour deposition technique is sputtering.

8. The process set forth in claim 7 wherein a target used in the sputtering is a sintered block or sintered powder of a compound oxide containing metal elements which are constituent elements of said intermediate compound oxide.

9. The process set forth in claim 8 wherein said sintered block or sintered powder is prepared by mixing powders of oxides, carbonates, nitrates or fluorides, each containing at least one of constituent metal elements of said intermediate compound oxide in such a manner that the resulting powder mixture contains the constituent metal elements except bismuth in predetermined atomic ratios and then by sintering the powder mixture.

10. The process set forth in claim 7 wherein said thin film is prepared by heating the substrate at a temperature lower than 800° C. during the sputtering.

11. The process set forth in claim 1 wherein the superconducting thin film is made of a compound oxide of Bi, Sr, Ca and Cu.

12. The process set forth in claim 11 wherein the compound oxide consists mainly of compound oxides represented by the general formula:

$$Bi_4(Sr_{1-x}, Ca_x)_m Cu_n O_{p+y}$$

in which "m", "n", "x" and "y" are numbers each satisfying respective ranges of $6 \leq m \leq 16$, $4 \leq n \leq 12$, $0.2 < x < 0.8$ and $-2 \leq y \leq +2$ and $p=2(6+m+n)$.

13. The process set forth in claim 12 wherein said superconductor is in a form of a thin film deposited on a substrate.

14. The process set forth in claim 12 wherein said intermediate compound oxide has a form of a thin film prepared on the substrate by physical vapour deposition technique.

15. The process set forth in claim 14 wherein the substrate is a single crystal of MgO, SrTiO$_3$, LaAlO$_3$ or LaGaO$_3$.

16. The process set forth in claim 15 wherein the thin film is deposited on {100} plane or {110} plane of the substrate.

17. The process set forth in claim 14 wherein said physical vapour deposition technique is sputtering.

18. The process set forth in claim 17 wherein a target used in the sputtering is a sintered block or sintered powder of a compound oxide containing metal elements which are constituent elements of said intermediate compound oxide.

19. The process set forth in claim 18 wherein said sintered block or sintered powder is prepared by mixing powders of oxides, carbonates, nitrates, or fluorides, each containing at least one of constituent metal elements of said intermediate compound oxide in such a manner that the resulting powder mixture contains the constituent metal elements except bismuth in predetermined atomic ratios and then by sintering the powder mixture.

20. The process set forth in claim 17 wherein said thin film is prepared by heating the substrate at a temperature lower than 800° C. during the sputtering.

* * * * *

UNITED STATES PATENT AND TRADEMARK OFFICE
CERTIFICATE OF CORRECTION

PATENT NO. : 4,942,152
DATED : July 17, 1990
INVENTOR(S) : Hideo ITOZAKI, ET AL

It is certified that error appears in the above-identified patent and that said Letters Patent is hereby corrected as shown below:

On the title page and in column 1:
In the title, line 1 thereof: delete "PREPARTING" and substitute therefor -- PREPARING --.

In the Abstract, lines 2-3 thereof: delete "Bi-S-r-Ca-Cu" and substitute therefor -- Bi-Sr-Ca-Cu --.

Column 7, line 60:
In Claim 5, line 2 thereof: delete "$LaAlO_3$" and substitute therefor -- $LaAlO_3$ --.

Signed and Sealed this

Seventh Day of January, 1992

Attest:

HARRY F. MANBECK, JR.

*Attesting Officer*    *Commissioner of Patents and Trademarks*